Aug. 12, 1958 J. W. THORNHILL 2,847,623

FULL WAVE RECTIFIER STRUCTURE AND METHOD OF PREPARING SAME

Filed July 27, 1955

INVENTOR

Jay W. Thornhill

BY Stevens, Davis, Miller & Mosher

ATTORNEYS 2,847,623
Patented Aug. 12, 1958

2,847,623

FULL WAVE RECTIFIER STRUCTURE AND METHOD OF PREPARING SAME

Jay W. Thornhill, Dallas, Tex., assignor to Texas Instruments Incorporated, Dallas, Tex., a corporation of Delaware Application July 27, 1955, Serial No. 524,744
10 Claims. (Cl. 317—234)

The present invention relates to a novel structure to be used as a full wave, high voltage semiconductor rectifier and to the method of making same. More particularly the present invention relates to a construction for a full wave, high voltage semiconductor diode in which junction type semiconductor bars or wafers are employed and to the method of making same.

It is the object of the present invention to provide an improved structure for a full wave, high voltage semiconductor rectifier or diode which will be characterized by the ability to withstand high voltages and great mechanical shock in use. By semiconductor is meant silicon, germanium and other materials having like properties. One of the principal problems in connection with semiconductor diodes or rectifiers, particularly of the junction type, is the difficulty of attaching lead connections to the semiconductor components. This problem arises principally due to the differences in thermal properties of the semiconductor material and the materials used to connect leads to the semiconductor material as well as the materials forming the leads themselves. Such differences in thermal properties, primarily thermal coefficients of expansion, frequently result in cracking or parting of the leads from the semiconductor element normally in the form of a bar or wafer.

It is a principal object of the present invention to provide a unique structure for a semiconductor rectifier or diode and method of making same whereby these problems will be solved and the danger of cracking or parting of the leads will be completely eliminated. Further, the construction is such that the overall structure is rigid and can be subjected to more than a normal amount of mechanical shock without danger of impairing the operation of the assembly.

It is a further object of the present invention to provide a full wave, high voltage semiconductor rectifier or diode which can be fabricated readily and easily in an economical fashion.

It is a further object of the present invention to provide a novel structure for a full wave, high voltage semiconductor rectifier or diode which will function in an efficient manner under severe conditions of use.

Other and further objects of the present invention will become more fully apparent from the following detailed description when taken in conjunction with the drawings in which.

Figures 1, 2, 7:
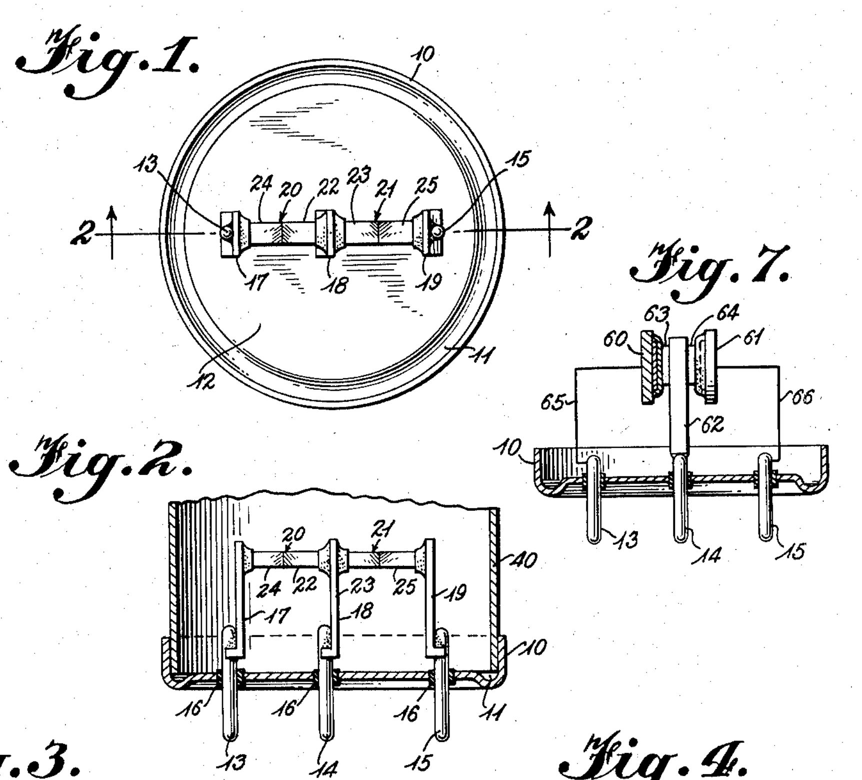
Figure 1 is a view in top plan of the novel structure.
Figure 2 is a view in section taken along line 2—2 of Figure 1.
Figure 7 is a view similar to Figure 2 showing an arrangement incorporating wafer elements.

Directing attention initially to Figures 1 and 2, there will be seen the full wave, high voltage semiconductor rectifier or diode. The assembly includes a three pin base which consists of a metal cup 10 made of "Kovar" which is an alloy of iron, nickel and cobalt and is produced commercially by the Driver-Harris Company of Harrison, New Jersey. This particular alloy is used quite extensively for glass-to-metal hermetic seals in the semiconductor art and undoubtedly it will be familiar. The cup 10 is formed with an annular depression 11 adjacent to its up-standing rim or wall for the purpose of receiving the edge of a can which normally encloses units of this type. Since the covering of semiconductor units by a can is entirely conventional in the art, it seems unnecessary to dwell upon it other than to mention it in passing. Retained in the metal cup 10 and projecting above and below it are a series of three pins 13, 14 and 15. These pins are insulated from the cup 10 by means of glass eyelets 16, as is conventional. The assembly described thus far would constitute a three-pin miniature base. It is possible to use a seven-pin miniature base of the type presently commercially available. By this means the assembly of the present invention could be used directly as a replacement for miniature tubes such as the 6X4 type.

Connected to pin 13 above the metal cup 10 is a tab 17 which is mounted in a vertical plane. The connection to the pin 13 can be by soldering or any other convenient procedure such as welding. Similarly, a tab 18 also lying in a vertical plane is connected to the pin 14 and a tab 19, likewise extending in a vertical plane, is connected to the pin 15. Extending between the tabs 17 and 18 at their upper ends is a semiconductor diode 20 and extending between the tabs 18 and 19 at their upper ends is a semiconductor diode 21. Each diode is composed of an n-type section and a p-type section with the n-type sections of the diodes 20 and 21 being designated as 22 and 23, respectively. The p-type sections of the diodes 20 and 21 are designated by the numerals 24 and 25, respectively. Although a grown junction bar is illustrated in conjunction with Figures 1 and 2, the method of the present invention is equally applicable to wafers. There is, of course, formed between the n- and p-type sections of each diode a rectifying junction which is represented graphically in Figures 1 and 2 by a transverse line located approximately at the mid-point of the diodes. The ends of the diodes 20 and 21 are prepared in a special manner as will be apparent hereinafter and are attached to the respective tabs 17, 18 and 19, whereby the diodes 20 and 21 will be suspended between each pair of tabs in spaced relation from the metal cup 10.

Due to the differences in thermal properties of semiconductor materials and metals and in particular differences in thermal coefficients of expansion, it is extremely difficult to attach connections to semiconductor materials. Accordingly, special techniques are employed by the present invention in order to make connections to the semiconductor material so that the connections will not part or crack off within the temperature ranges in which the unit will be operated. Thus, the semiconductor bars or wafers are attached to the tabs 17, 18 and 19 in a unique fashion to eliminate completely the possibility of cracking or parting during use in the temperature ranges encountered during operation.

Figure 3:
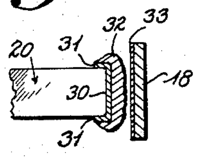
Figures 3 and 4 are views in section illustrating in detail the manner in which connections are made.
Figure 4:
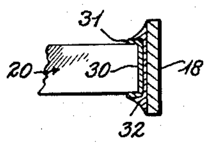

The specific structural arrangement for the connections as well as the method which is utilized to make the connections will now be described in some detail with reference to Figures 3 and 4. The semiconductor bars 20 and 21 are first prepared by sand-blasting their end surfaces. The purpose for this is essentially two-fold, namely, first to cleanse the ends of the semiconductor bars by removing foreign matter and greases in particular; and secondly to roughen the ends of the semiconductor bars so that it will be possible to coat the ends and so that the coating will obtain a good grip on the semiconductor bar. Subsequent to this, the ends of the semiconductor bars are plated or otherwise coated with a metal such as nickel, rhodium or other equivalent in the fashion particularly illustrated in Figure 3. For purposes of discussion, the following will be limited to nickel, however, it will be fully appreciated that other like metals can conveniently be substituted. The end of a semiconductor bar, say for example bar 20, is plated with nickel to form a substantially cup-shaped nickel layer 30 which not only covers the end of the semiconductor bar 20 being treated, but also extends slightly around the semiconductor bar 20 as indicated by the portions 31 of the nickel coating whereby the coating will cup the end of the semiconductor bar 20. This particular technique insures that the nickel will not only be in contact with the end surface of the block 20 but also will extend slightly around the semiconductor bar and grip it at these points as well.

After the end of the bar has been nickel plated as above described, it is then tinned with substantially pure tin using a soldering iron. In this operation, the tin is placed onto the nickel plating 30 somewhat in the form of an irregularly shaped mass of tin 32 which likewise extends slightly around the semiconductor bar 20 overlying the nickel plating at substantially all points. Thereafter, the tab, for example tab 18, is tinned and upon completion of this step, the semiconductor bar 20 is brought against the tab 18 so that the mass of tin 32 will be in contact with the tin layer of the tab 18. For convenience, the tin layer of the tab 18 is designated by the numeral 33. In this position, the end of the silicon block 20 is soldered to the tab 18. In this operation, care must be taken to utilize a soldering iron which will not exceed approximately 350° C. for its operating temperature. If the soldering iron is too hot, the inner face between the end of the semiconductor bar 20 and the nickel plating 30 will crack or part due to the differences in coefficients of thermal expansion of these two materials. In this soldering operation a solution of zinc chloride and ammonium chloride in water can conveniently be used as the flux.

The tabs 17, 18 and 19 are composed of a material having thermal properties closely akin to those of the semiconductor material of bars 20 and 21. It is important that the materials of the tabs and bars have coefficients of thermal expansion closely related. It is preferred that the tabs be composed of "Therlo" which is an iron-nickel-cobalt-molybdenum alloy prepared commercially by the Driver-Harris Co. of Harrison, New Jersey. The coefficient of thermal expansion of this material is close to that of silicon and germanium in the temperature range of −50° C. to 150° C. the operating range for the units of the invention. The tabs can be soldered or welded to the pins thereby making for ease of assembly of the units.

During soldering of the bars to the tabs a pressure is exerted to force the two elements together. By virtue of this action, tin is squeezed out from between the end of the bar and the tab so that the end of the bar lies substantially against the surface of the tab. There remains, however, a relatively thin layer of tin between the end of the bar and the tab. This remaining layer is thin enough so that it will comply with the expansion and contraction of the tab and bar during temperature variations.

The sequence of soldering of the ends of the semiconductor bars 20 and 21 onto the tabs 17, 18 and 19 is of significance. Care must be taken at all times to insure that the semiconductor bars are supported by at least one tab. The preferred procedure for soldering the two diodes 20 and 21 onto the three tabs 17, 18 and 19 is as follows. First, one of the diodes 20 or 21 which has been prepared in accordance with the procedure outlined above, namely by being nickel plated and tinned at both ends, is brought into contact with the center tab 18 which has been previously tinned. Thereafter, the particular diode is soldered to the center tab 18. Subsequent to this the other end of the same diode is brought into contact with its respective tab, for the case of diode 20—tab 17, and for the case of diode 21—tab 19, the tab being previously tinned as described, and the other end is soldered to its respective tab. Thereafter, the other diode is brought into contact with the center tab 18 and soldered to it. During the soldering operation, the first soldered diode will be supported by the tab 17, in the case of diode 20, or the tab 19, in the case of diode 21, even though the solder connection to the center tab 18 becomes molten. Finally, the other end of the second diode is soldered to its respective tab, tab 17 in the case of diode 20, and tab 19 in the case of diode 21. It will thus become apparent that during the soldering operations, at least one end of each semiconductor bar is attached to a tab at all times.

An alternative procedure for soldering the diodes in place would consist in first soldering diode 20 to the tab 17 and then solder diode 21 to the tab 19. As a final soldering operation, the other ends of the diodes 20 and 21 could be brought into contact with the center tab 18 and both ends would be simultaneously soldered in a single operation.

After the soldering operations have been completed the electrical properties of the diodes are improved in the following manner. The first step in preparing the structure is to wash it in hot distilled water. The temperature of the water during this washing operation should be approximately 90° C. It has been found that approximately three changes of water are helpful during the washing operation. Although the hot water has been specified as 90° C., it will no doubt be appreciated that minor variations of this temperature are permissible. This washing operation is to remove all traces of flux.

After having been washed in hot water, the unit is then placed in an oven where it is dried. It is recommended that the oven be at a temperature of approximately 120° C. and under these circumstances it is possible to dry the units in approximately 15 minutes. Again, there may be some variation in the temperature of the oven and it should be apparent that a higher temperature would normally produce a shorter drying period. It is, of course, essential in the drying operation not to use an excessive temperature in the oven as it is entirely possible to damage the p-n junctions of the diodes. In like manner, an excessive temperature in the oven could also soften the solder thereby weakening the joints. For this reason, it is recommended that the temperature of the oven not be greatly in excess of 120° C. Additionally, lower temperatures can be used for the drying operation, but under these circumstances, the drying period becomes lengthened and such is an undesirable result from a standpoint of a commercial operation as the drying of the units can become a bottle-neck to production. It would also be possible to use a vacuum oven. By this means drying would be speeded up and improved results would be obtained.

Following the drying of the units, they are removed from the oven and all metal parts are masked with a suitable masking composition, as for example a solution of polyethylene in toluene. By all metal parts, of course, is meant all metal parts with the exception of the semiconductor bars. The masking is for the purpose of the next step which is the etching of the diodes and as will be readily apparent, the diodes must be exposed to the etching medium. In order to assist in the masking of the units, it is recommended that a dye be placed in the masking material so that the persons engaged in masking will be able to control the extent to which the units are masked. It has been found particularly useful to employ a red dye such as Sudan III, manufactured by Allied Chemical and Dye Corporation in the masking material.

Following the masking of the units, they are then subjected to etching which can be conducted in an etch solution known in the trade as "CP–4." This particular etching medium is recognized in the art as a standard etch for semiconductor components and was developed by Bell Telephone Laboratories, Inc. The etching medium is composed of a group of chemically pure acids in about the following proportions: Hydrochloric acid—15 cc.; nitric acid—25 cc.; glacial acid—15 cc.; and bromine—5 drops. This particular etching medium, as mentioned above, is a standard etch and is recognized throughout the art for use in connection with silicon and germanium. The units are immersed in the standard etch solution for approximately two minutes and then removed and washed in distilled water. The washing of the units is carried out until all traces of the etch solution have been removed and thereafter the units are dried in an oven. Again it is recommended that the oven be at a temperature of approximately 120° C.

Subsequent to the washing in distilled water and drying in an oven, the units are then examined to determine the electrical properties of the junctions. The testing is conducted in essentially two vanes by subjecting the units to a high reverse voltage to check the reverse leakage current through the junction and by subjecting the units to a forward voltage to check the soldered connections and the forward characteristics of the diode. For the units which test satisfactorily, the following additional treatment is necessary: The masking of the metal parts is removed by a solvent, as for example, by washing the units in a hot carbon tetrachloride bath. The units remain in the bath until all traces of the masking material have been removed from them. Thereafter, the units are removed from the hot carbon tetrachloride bath and then placed into an oven which is again at a temperature of 120° C. and baked for a period of about 15 minutes.

After the units have been removed from the oven, they are processed by painting the semiconductor rectifier or diode bars 20 and 21 with a suitable protective material to cover the junctions. For example, the bars 20 and 21 can be painted with a material known as "Dow Corning 997, Silicone Varnish" which is a material prepared commercially by the Dow Corning Company, and is a varnish including an organo-silicone resin. Painting the bar with the material above mentioned requires that the units be placed into an oven and baked at a temperature of approximately 150° C. for a period of approximately 24 hours in order to cure the resinous material and harden the protective coating. An alternative procedure which may be employed to protect the junction of the diodes 20 and 21 would be to use a material such as for example "CIBA 502" known in the trade as "Araldite" and composed essentially of a resinous material. Use of this material requires that the units be placed in an oven and baked at a temperature of approximately 150° C. for a period of about 6 hours as these conditions are necessary to cure the resinous material and harden same. The principal purpose of covering the junctions with a resinous material is to protect them from stray metal vapors and flux while soldering the cap on the unit.

The final step in the assembly of the unit is attaching the cap 40 onto the cup 10 in the depression 11. One procedure for fixing the cap would be to solder the cap onto the cup 10 or alternatively the cap could be ring welded onto the cup 10. In either case, this step must be conducted in an inert dry atmosphere, as for example pure nitrogen. If the cap is ring welded onto the cup 10, it is conceivable that the step of covering the junctions with a plastic material can be eliminated since the ring welding operation will have a much less tendency to harm the junctions than would the soldering operation.

Figure 5:
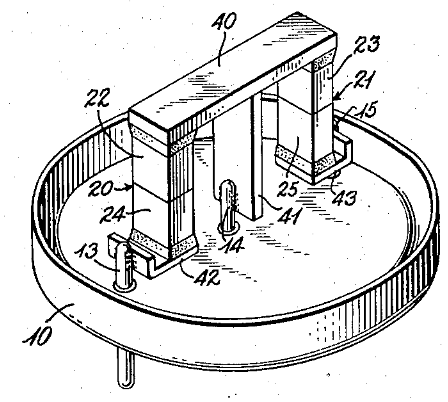
Figure 5 is a view in perspective illustrating an alternative arrangement for the assembly.
Figure 6:
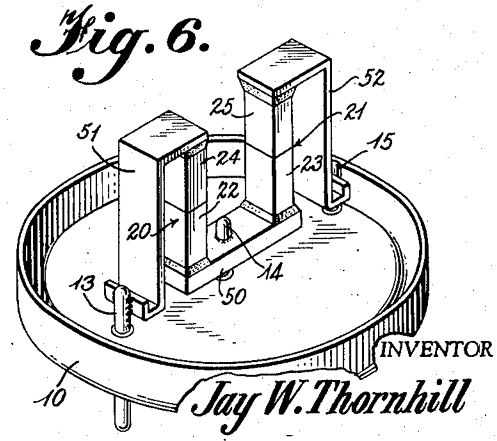
Figure 6 is a perspective view illustrating a still further alternative arrangement for the assembly.

Alternative arrangements for the full wave, high voltage diodes are illustrated in Figures 5 and 6. As will be appreciated it is essential, as in any full wave rectification operation, to have the pair of diodes connected in common at one end. This is achieved in the embodiment of the invention described with reference to Figures 1 and 2 by having one end of each of the bars 20 and 21 connected to the center tab 18. In Figure 5, this is achieved but in a slightly different manner. According to the illustration in Figure 5, the two bars 20 and 21, in place of lying in a plane substantially parallel to the metal cup 10, lie in a plane substantially normal to the metal cup 10. Accordingly, the n-type sections of each of the two bars 20 and 21 are each connected to a tab 40 which spans across the two bars 20 and 21. An additional tab 41 is soldered to the tab 40 at its upper end and at its lower end is soldered or welded to the pin 14. A tab 42 soldered or welded to pin 13 underlies the bottom of the bar 20 with the bar 20 being soldered to it. In like manner, tab 43 soldered or welded to pin 15 underlies the bar 21 which likewise is soldered to it.

A still further arrangement for the assembly is illustrated in Figure 6 where again the two bars 20 and 21 are mounted in a plane substantially normal to the metal cup 10. In this case, the n-type regions 22 and 23 are at the lower ends of the bars 20 and 21 and these n-type sections are soldered to a common tab 50 through which the pin 14 projects. The pin 14 is, in these circumstances, soldered to the tab 50. Substantially L-shaped tabs 51 and 52 are provided respectively soldered to the p-type sections 24 and 25 of the bars 20 and 21. The tab 51 is fixed to the pin 13 and the tab 52 is fixed to the pin 15.

An organization is shown in Figure 7 in which is incorporated a pair of wafers 60 and 61 each characterized by a rectifying junction. In this assembly a center tab 62 is provided having raised portions 63 and 64 projecting on opposite sides. A wafer is attached to each raised portion by the method described in the foregoing. Attached to the faces of wafers 60 and 61 remote from tab 62 are wires 65 and 66. The center tab is attached to pin 14 held by metal cup 10, the wire 65 is attached to pin 13, and the wire 66 is attached to pin 15.

Although the present invention has been shown and described with respect to particular embodiments and also with reference to a preferred method for fabricating the units, nevertheless, it is felt that various changes and modifications in both the construction and method for preparing the units which are obvious to one skilled in the art and which do not depart from the spirit, scope and contemplation of the invention, as outlined above, are fully within the purview of this invention.

What is claimed is:

1. A structure for use as a full wave rectifier comprising a pair of semiconductor elements each characterized by an n-type region and a p-type region with a p–n junction formed therebetween, a metallic coating embracing an area of the surface of each said element in its n-type region, a substantially pure layer of tin overlying each said metallic coating, a conductor fixed in common to said tin layers, and conductive means attached to the p-type regions of said elements.

2. A structure as defined in claim 1 wherein said conductor is composed of a material whose coefficient of thermal expansion is close to that of the semiconductor material of said elements.

3. A structure as defined in claim 1 wherein said elements are composed of a semiconductor material selected from the class consisting of silicon and germanium.

4. A structure as defined in claim 1 wherein said elements are made of silicon.

5. A structure as defined in claim 1 wherein said elements are made of germanium.

6. A structure as defined in claim 1 wherein said metallic coatings are selected from the class consisting of nickel and rhodium.

7. A structure as defined in claim 1 wherein said metallic coatings are nickel.

8. A structure as defined in claim 1 wherein said metallic coatings are rhodium.

9. A structure for use as a full wave rectifier comprising a pair of semiconductor wafers each characterized by a p-type region and an n-type region with a p–n junction formed therebetween, a metallic coating embracing an area of the surface of each said wafer in its n-type region, a substantially pure layer of tin overlying each said metallic coating, a conductor having a pair of raised portions, said wafers being attached to said conductor in common with each raised portion attached to a tin layer, and conductive means attached to the p-type regions of said wafers.

10. A structure for use as a full wave rectifier which comprises a pair of semiconductor bars each characterized by n-type conductivity at one end and p-type conductivity at the other end with a p–n junction formed therebetween, a cup shaped metallic coating embracing each end surface of said bar and a small portion of the side surfaces of said bar, a substantially pure tin layer covering said metallic coatings, a conductor attached in common to the ends of said bars characterized by n-type conductivity, and conductive means attached to the other ends of said bars.

References Cited in the file of this patent

UNITED STATES PATENTS

| | | |
|---|---|---|
| 2,402,661 | Ohl | June 25, 1946 |
| 2,804,581 | Lichtgarn | Aug. 27, 1957 |